US012782405B2

(12) United States Patent
Stumpf et al.

(10) Patent No.: US 12,782,405 B2
(45) Date of Patent: Nov. 3, 2026

(54) TEST AND/OR MEASUREMENT SYSTEM

(71) Applicant: Rohde & Schwarz GmbH & Co. KG, Munich (DE)

(72) Inventors: Christopher Stumpf, Munich (DE); Daniel Mueller-Remer, Guenzburg (DE); Julian Harms, Munich (DE); Marius Haisch, Memmingen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 207 days.

(21) Appl. No.: 18/926,465

(22) Filed: Oct. 25, 2024

(65) Prior Publication Data

US 2026/0118397 A1 Apr. 30, 2026

(51) Int. Cl.
*G01R 27/28* (2006.01)
*G01R 29/26* (2006.01)

(52) U.S. Cl.
CPC ............ *G01R 27/28* (2013.01); *G01R 29/26* (2013.01)

(58) Field of Classification Search
CPC ................................ G01R 29/26; G01R 27/28
See application file for complete search history.

(56) References Cited

U.S. PATENT DOCUMENTS 6,714,898 B1 3/2004 Kapetanic et al.
2018/0246153 A1* 8/2018 Pandya ................. G01R 27/28
2023/0280373 A1 9/2023 Ramian

* cited by examiner

*Primary Examiner* — Minh Q Phan
(74) *Attorney, Agent, or Firm* — Studebaker Brackett PLLC

(57) ABSTRACT

The present disclosure relates to test and/or measurement system including a base unit with a test ports connectable to a DUT. The base unit includes a port unit connected to one of the test ports. The port unit includes an image-free receiver circuit. An input of the circuit is connected to the one test port. The system includes an ADC unit. An output of the circuit is connected to the ADC unit. A signal source generates a stimulus signal and/or a known noise source to generate a noise signal. If the system operates in an S-parameter measurement mode, the stimulus signal is feedable to a first port of the DUT; and/or, if the system operates in a noise measurement mode, the noise signal is feedable to the first port or to a second port of the DUT. The input connects to the first or second port of the DUT.

20 Claims, 6 Drawing Sheets

TEST AND/OR MEASUREMENT SYSTEM

TECHNICAL FIELD

The disclosure relates to a test and/or measurement system, such as a vector network analyzer (VNA), which is capable of measuring S-parameters and noise properties of a device-under-test (DUT).

BACKGROUND ART

A vector network analyzer (short: VNA) is a device that can be used to measure the performance of RF (radio frequency) devices and networks. For instance, VNAs enable the precise analysis of key RF properties, such as impedance, reflection, and transmission, making VNAs essential for designing and testing antennas, filters, amplifiers, and other RF components.

The system architecture of many conventional VNAs includes a dedicated measuring path for conducting S-parameters measurements of a connected device-under-test (DUT). There is also an increasing demand for noise measurements on the market. However, to characterize a noise number of a DUT within a reasonable measuring time, the measuring path for the conventional S-parameter measurements is not suitable.

SUMMARY

Thus, there is a need to provide an improved test and/or measurement system, which avoids the above-mentioned disadvantages.

These and other objectives are achieved by the embodiments provided in the enclosed independent claims. Advantageous implementations of the present disclosure are further defined in the dependent claims.

According to a first aspect, the disclosure relates to a test and/or measurement system. The test and/or measurement system comprises: a base unit comprising a plurality of test ports which are connectable to a device-under-test (DUT); wherein the base unit comprises at least one port unit which is electrically connected to one of the plurality of test ports; wherein the at least one port unit comprises an image-free receiver circuit, wherein an input of the image-free receiver circuit is directly or indirectly connected to the one test port. The test and/or measurement system further comprises: at least one ADC unit, wherein an output of the image-free receiver circuit is electrically connected to the at least one ADC unit; and a signal source configured to generate a stimulus signal and/or a known noise source configured to generate a noise signal; wherein, if the test and/or measurement system operates in an S-parameter measurement mode, the stimulus signal is feedable to a first port of the DUT; and/or, if the test and/or measurement system operates in a noise measurement mode, the noise signal is feedable to the first port or to a second port of the DUT; wherein the input of the image-free receiver circuit is connectable to the first port or the second port of the DUT.

This achieves the advantage that a test and/or measurement system is provided which is capable of performing both S-parameter and noise measurements with a DUT. For instance, the noise measurement does not require a frequency sweep of the noise signal which strongly enhances the measurement speed of the noise measurement.

The test and/or measurement system can be a vector network analyzer. The test and/or measurement system can be operable in the noise measurement mode and in the S-parameter measurement mode. For instance, both modes are executed one after the other to measure a connected DUT.

The test and/or measurement system can comprise a plurality of port units, each port unit can be connected to one of the plurality of test ports. One, more or all of the port units can comprise a respective image free receiver circuit. For example, at least two or all port units can comprise the same components and have the same general functionality. Some port units may also comprise additional components. For instance, the signal source and/or the noise source could be a component of one of the port units.

The DUT can be an RF (radio frequency) device under test. The DUT can have at least two ports. Each port of the DUT can be an input and/or an output port for RF signals.

In an implementation form, a frequency bandwidth of the at least one ADC unit is equal or greater than a frequency bandwidth of the image-free receiver circuit it is connected to. This provides the advantage that the measurement speed can be increased. Alternatively, the frequency bandwidth of the at least one ADC unit could also be smaller than the frequency bandwidth of the image-free receiver circuit it is connected to.

In an implementation form, the image-free receiver circuit comprises a low noise amplifier; and the image-free receiver circuit comprises a low-pass filter unit and/or a conversion unit, wherein the conversion unit is configured to convert an RF signal received at the input of the image-free receiver circuit to an image-free intermediate frequency (IF) signal and to output the image-free IF signal at the output of the image-free receiver circuit.

The RF signal received at the input of the image-free receiver circuit can be the stimulus signal or the noise signal (or a portion of these signals).

For example, the conversion unit comprises at least one of: an image rejection mixer, an image rejection circuit based on a filter bank, an image rejection circuit based on a tunable bandpass filter, or a multiple conversion receiver.

In an implementation form, the at least one port unit comprises a switching unit, wherein the switching unit is configured to alternatively switch the conversion unit and the low-pass filter unit between the low noise amplifier and the output of the image-free receiver circuit.

For example, one, more or all of the port units can comprise a respective switching unit.

In an implementation form, the signal source is arranged in the base unit or in a housing which is external to a housing of the base unit, or wherein at least one or all port units comprise a respective signal source.

In an implementation form, the known noise source is arranged in the base unit or in a housing which is external to a housing of the base unit, or wherein at least one or all port units comprise a respective known noise source.

In an implementation form, the test and/or measurement system comprises a further switching unit which is configured to switch the signal source to the first port of the DUT if the test and/or measurement system operates in the S-parameter measurement mode and/or to switch the known noise source to the first or the second port of the DUT if the test and/or measurement system operates in the noise measurement mode.

In an implementation form, the known noise source is an active noise source or a passive noise source. For example, the active noise source comprises at least one noise diode, and the passive noise source comprises at least one resistor.

In an implementation form, the known noise source has an impedance that matches the system impedance of the at least one port unit that is connected to the DUT; or the known noise source comprises an impedance tuner in case the impedance of the known noise source does not match the system impedance of the at least one port unit that is connected to the DUT. For instance, via the impedance tuner, the impedances of the known noise source and the system impedance of the port unit can be matched.

In an implementation form, the at least one port unit comprises a further receiver circuit wherein an input of the further receiver circuit is directly or indirectly connected to the one test port.

For example, one, more or all of the port units comprise a respective further receiver circuit.

In an implementation form, the test and/or measurement system comprises a directive network which is electrically connected to the signal source, the image-free receiver circuit, the further receiver circuit, and one of the plurality of test ports.

For example, one, more or all of the port units comprise a respective directive network.

In an implementation form, if the test and/or measurement system is operated in the S-parameter measurement mode, the directive network is configured to forward a first part of the stimulus signal to the DUT, a second part of the stimulus signal to one of the image-free receiver circuit or the further receiver circuit, and a reflection of the first part of the stimulus signal from the DUT to the other one of the image-free receiver circuit or the further receiver circuit.

In an implementation form, if the test and/or measurement system is operated in the S-parameter measurement mode, the directive network is configured to forward the stimulus signal after being transmitted by the DUT to the image-free receiver circuit or the further receiver circuit.

These two measurements (i.e., the measurement of the generated and reflected stimulus signal and the measurement of the transmitted stimulus signal) can be carried out simultaneously by two separate port units of the system which are both connected to different ports of the DUT, or alternately by the same port unit.

In an implementation form, the at least one port unit comprises a local oscillator which is configured to generate an LO signal; wherein the local oscillator is electrically connected to both the image-free receiver circuit and the further receiver circuit of the respective port unit. For example, one, more or all of the port units comprise a respective local oscillator.

In an implementation form, the test and/or measurement system comprises at least one further ADC unit, wherein an output of the further receiver circuit is electrically connected to the at least one further ADC unit.

For example, the at least one port unit comprises two of the at least one ADC unit and at the least one further ADC unit. One, more or all of the port units can comprise at least two ADC units.

In an implementation form, the test and/or measurement system comprises a processor which is configured to determine S-parameters of the DUT if the test and/or measurement system is operated in the S-parameter measurement mode, and/or to determine noise properties of the DUT if the test and/or measurement system is operated in the S-parameter measurement mode.

For example, the processor is configured to determine the S-parameters first and to use said S-parameters to determine the noise properties.

In an implementation form, the noise properties comprise at least one of the following: a noise figure, a noise parameter, a gain-over-temperature value, a noise spectral density, an excess noise ratio, and a noise temperature.

BRIEF DESCRIPTION OF THE DRAWINGS

The above-described aspects and implementation forms of the present disclosure will be explained in the following description of specific embodiments in relation to the enclosed drawings, in which.

DETAILED DESCRIPTIONS OF EMBODIMENTS

Figure 1:
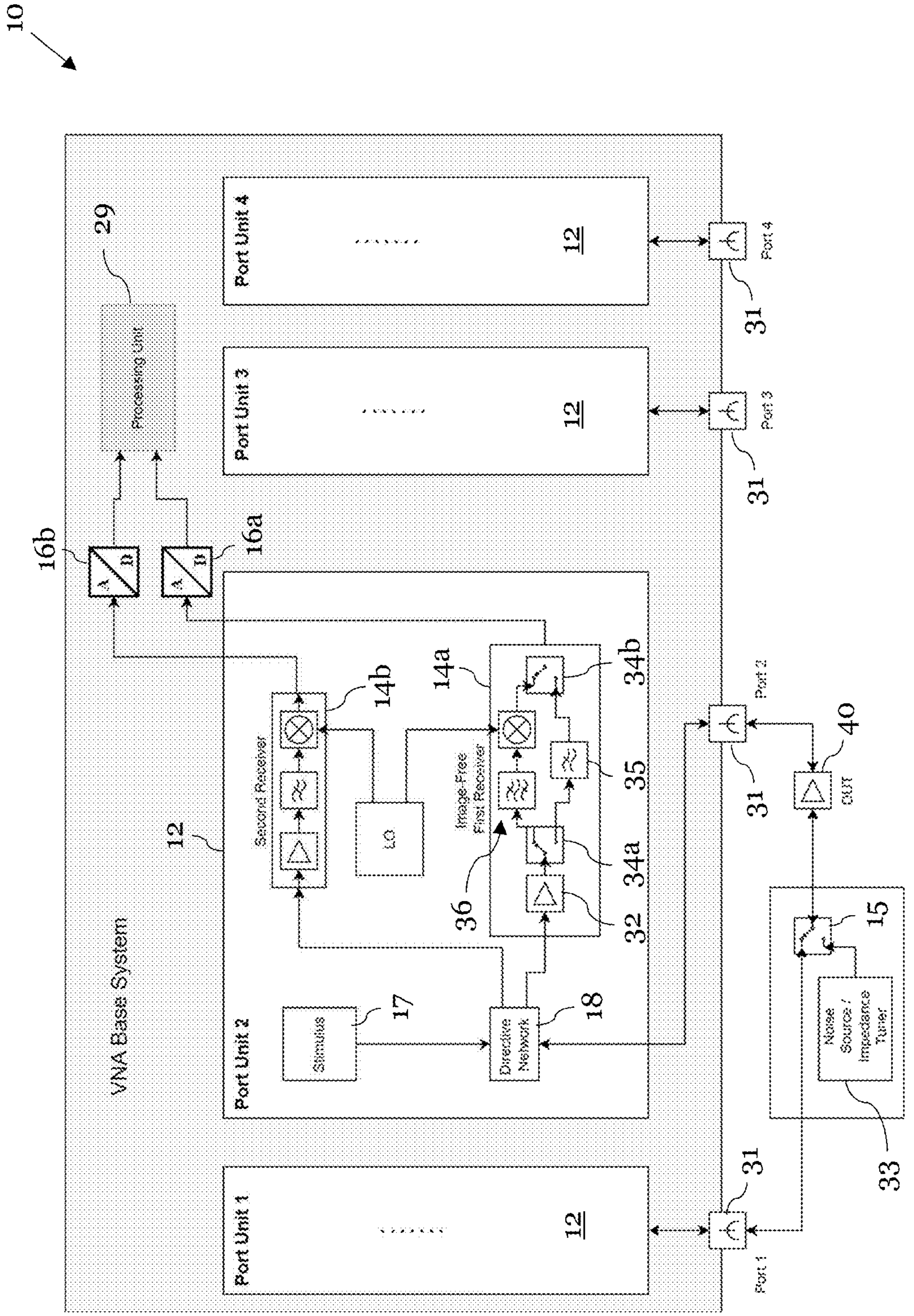
FIG. 1 shows a schematic diagram of a test and/or measurement system according to an embodiment.

FIG. 1 shows a schematic diagram of a test and/or measurement system 10 according to an embodiment.

The test and/or measurement system 10 comprises: a base unit 11 comprising a plurality of test ports 31 which are connectable to a DUT 40; wherein the base unit 11 comprises at least one port unit 12 which is electrically connected to one of the plurality of test ports 31; and wherein the at least one port unit 12 comprises an image-free receiver circuit 14*a* (also referred to as: image free receiver unit), wherein an input of the image-free receiver circuit 14*a* is directly or indirectly connected to the one test port 31 (i.e., to the test port 31 its port unit 12 is connected to).

The test and/or measurement system 10 further comprises: at least one ADC unit 16*a*, wherein the output of the image-free receiver circuit 14*a* is electrically connected to the at least one ADC unit 16*a*; and a signal source 17 configured to generate a stimulus signal and/or a known noise source 33 configured to generate a noise signal; wherein, if the test and/or measurement system 10 operates in an S-parameter measurement mode, the stimulus signal is feedable to a first port of the DUT 40; and/or, if the test and/or measurement system 10 operates in a noise measurement mode, the noise signal is feedable to the first port or to a second port of the DUT 40; wherein the input of the image-free receiver circuit 14*a* is connectable to the first port or the second port of the DUT 40.

The test and/or measurement system 10 can be a vector network analyzer (VNA) or a VNA system. The test ports 31 can be DUT ports of the system 10 (i.e., ports for connecting a DUT).

The DUT 40 can be an RF device-under-test, such as an antenna, a filter, an amplifier, or another RF component. The DUT 40 can be a two-port device which can transmit RF signals. The first and/or the second port of the DUT 40 can each form an input and/or an output port (i.e., the DUT 40 can receive and/or forward signals via each of these ports).

The connections in the system 10 can be direct or indirect connections, i.e., there can be further elements connected between two components that are indirectly connected (e.g., switches, capacitors filters, etc.). For instance, the input of the image free receiver circuit 14*a* is indirectly connected to the test port 31 via a directive network 18. Herein, connections between devices and/or components generally refer to electrical connections suitable for transmitting signals.

The test and/or measurement system 10 can comprise a plurality of port units 12, each port unit 12 can be connectable to one of the plurality of test ports 31. At least one or all of the port units 12 can comprise a respective image free receiver circuit 14*a*. Furthermore, at least one or all of the port units 12 can comprise the signal source 17 and/or the known noise source 33.

Some or all of the port units 12 can comprise a respective signal source 17. Alternatively, the signal source 17 can be provided in the base unit 11 or in a housing external to the housing of the base unit 11. Likewise, some or all of the port units 12 can comprise a respective known noise source 33. Alternatively, the known noise source 33 can be provided in the base unit 11 or in a housing external to the housing of the base unit 11.

In exemplary system 10 shown in FIG. 1, one of the port units 12 (Port Unit 2) comprises the signal source 17 and the image-free receiver circuit 14*a*, while the known noise source 33 is comprised by an external element, e.g. a frontend unit. In the exemplary systems 10 shown in FIG. 2 or 3, one of the port units 12 (Port Unit 1) comprises both a signal source 17 and a known noise source 33.

For instance, a port unit 12 and a further port unit 12 (and/or an external frontend comprising the noise source 33) can be connected to different ports of the DUT 40, as shown in FIG. 1. In this way, transmission measurements can be performed with the DUT 40, e.g., for the S-parameter characterization and for the noise measurements.

The base unit 11 and the port units 12 can be arranged in the same housing or in separate housings. In the former case, the port unit(s) 12 can be formed by internal circuity of the base unit 11. The port units 12 can be interface units or circuits.

The ADC unit 16*a* can be a component of the base unit 11 or one of the port units 12. The bandwidth (i.e., frequency bandwidth) of the ADC unit 16*a* can be equal or greater than the bandwidth of the image-free receiver circuit 14*a* it is connected to. By having an ADC unit with a larger bandwidth than the receiver circuit, the overall measurement speed can be increased. Alternatively, the bandwidth of the ADC unit 16*a* could also be smaller than the bandwidth of the image-free receiver circuit 14*a*.

The system 10 can comprise a switching unit 15 which is configured to switch: a) the signal source 17 to a port of the DUT 40 if the test and/or measurement system operates in S-parameter measurement mode; and b) the known noise source 33 to a port of the DUT 40 if the test and/or measurement system operates in the noise measurement mode. For instance, the switching unit 15 is arranged in a port unit 12 which comprises both the signal source 17 and the known noise source 33, as shown in the exemplary systems 10 of FIG. 2 or 3, where the switching unit 15, the signal source 17 and the noise source 33 are arrange in the first port unit 12 (Port Unit 1).

The known noise source 33 can be an active noise source which comprises, for example, at least one noise diode. For instance, the active noise source receives electrical power to generate the known noise signal. Alternatively, the known noise source 33 can be a passive noise source which comprises, for example, at least one resistor (e.g., a 50 ohm resistor).

The known noise source 33 can have a known noise factor and/or input impedance that corresponds to a system impedance.

Alternatively, the known noise source 33 comprises an impedance tuner in case the (input) impedance of the known noise source does not match the system impedance of the at least one port unit that is connected to the DUT. The impedance tuner can be used to change the impedance of the known noise source 33 to match the system impedance.

At least one or all port units 12 can comprise a further receiver circuit 14*b* which also directly or indirectly connected to the test port 31. For example, the further receiver circuit 14*b* is used for the S-parameter measurements, but not for the noise measurements. The further receiver circuit 14*b* might not be an image-free receiver and can thus have a simpler structure than the image-free receiver circuit 14*a*.

The test and/or measurement system can comprise at least one directive network 18. For instance, at least one or all port units 12 can comprise a respective directive network 18. The directive network 18 can comprise a directional coupler and/or a bridge directive element which can be a single element or a plurality of elements comprising (but not limited to) switches and couplers.

The directive network 18 can be electrically connected to the signal source 17, the image-free receiver circuit 14*a*, the further receiver circuit 14*b*, and one of the plurality of test ports 31, in particular to the test port 31 its port unit 12 is connected to.

When operating in the S-parameter measurement mode, the system 10 can be configured to measure S-parameters of the DUT at different frequencies.

Therefore, the directive network 18 can be configured to forward a first part of the generated stimulus signal to a test port 31 connected to the DUT 40; a second part of the stimulus signal to one of the receiver circuits 14*a*, 14*b* of a port unit 12 (connected to said test port 31), and a reflection of the first part of the stimulus signal from the DUT which is received via said test port 31 to the other one of the receiver circuits 14*a*, 14*b* of the port unit 12.

In addition, the directive network 18 can be configured to forward the stimulus signal, after being transmitted by the DUT 40 to one of the receiver circuits 14*a*, 14*b* which is connected to said test port 31.

Figure 2:
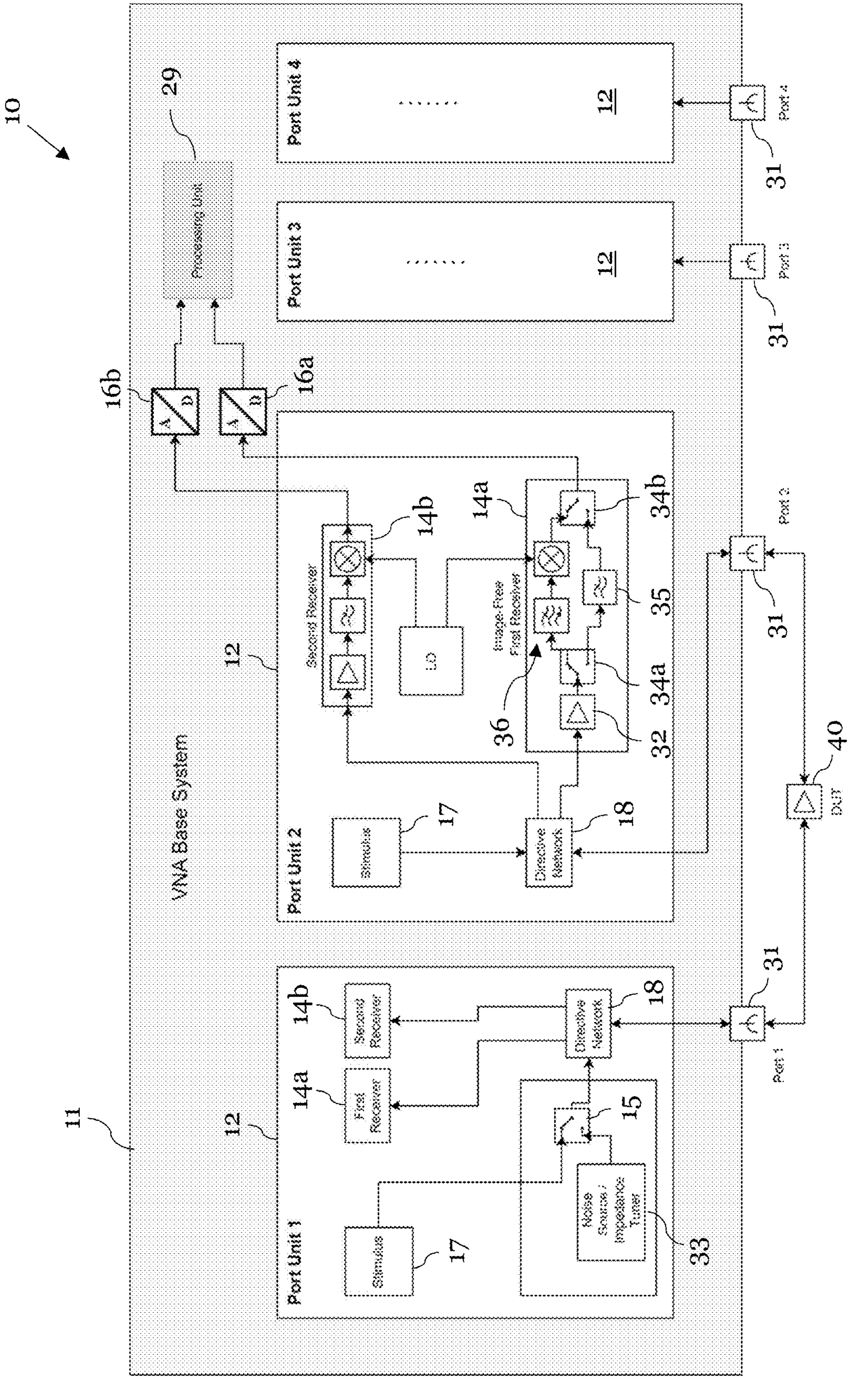
FIG. 2 shows a schematic diagram of a test and/or measurement system according to an embodiment.
Figure 3:
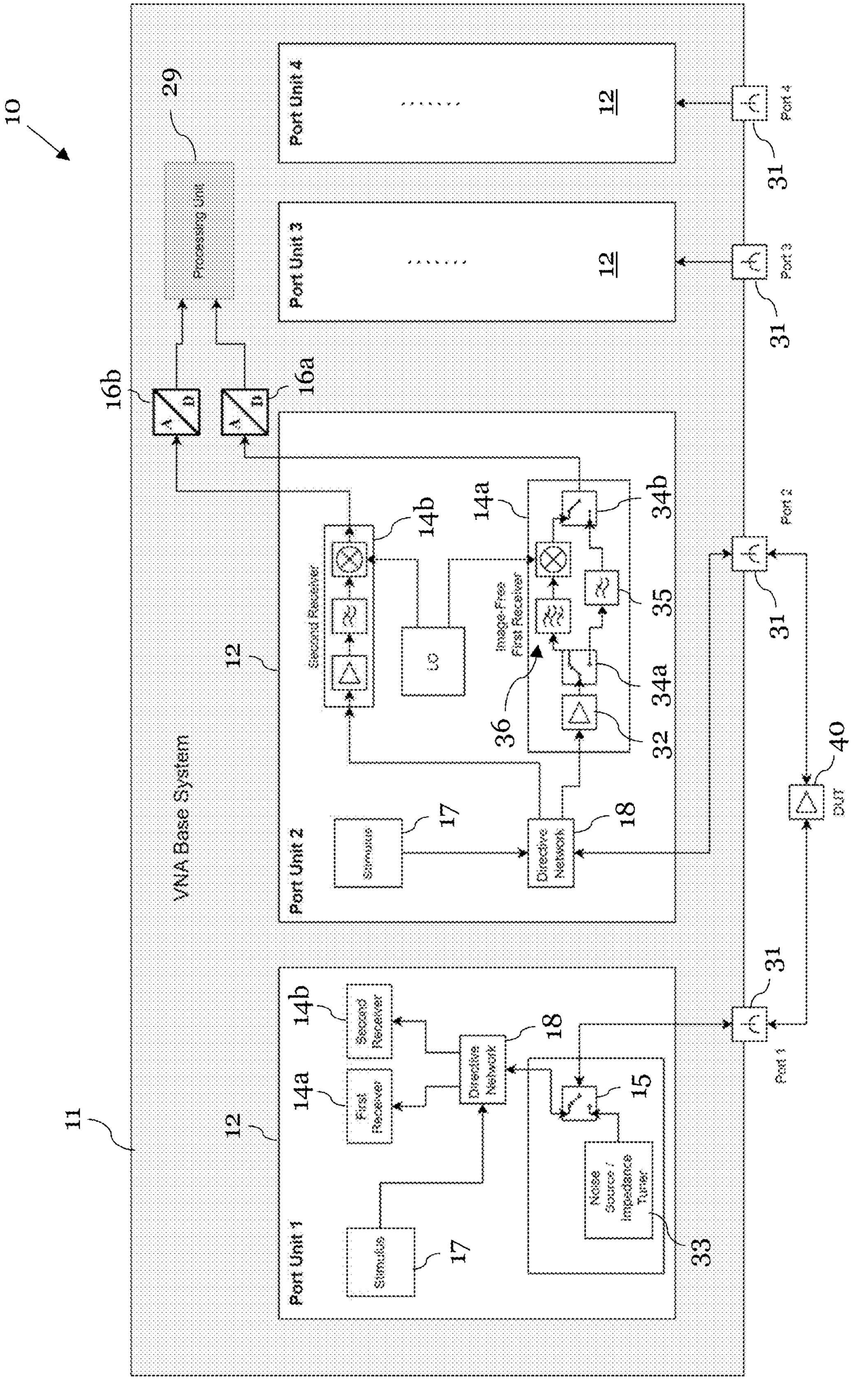
FIG. 3 shows a schematic diagram of a test and/or measurement system according to an embodiment.

These two measurements (i.e., the measurement of the generated and reflected stimulus signal and the measurement of the transmitted stimulus signal) can be carried out by two separate port units 12 which are both connected to different ports of the DUT 40, as e.g. shown in FIGS. 1-3 for Port Unit 1 and 2. These measurements by different two port units 12 could be carried out simultaneously. However, the two measurements can also be carried out alternately by the same port unit 12.

The stimulus signal can be a CW (continuous wave) signal that is swept through a specified frequency range during the S-parameter measurements, wherein a number of individual measurements of the generated/reflected/transmitted stimulus signal are carried out at different frequencies. The stimulus signal may also be referred to as test signal.

At least one or all port units 12 can comprise a local oscillator LO which can be connected to the image-free and/or the further receiver circuit 14*a*, 14*b* of the port unit 12. The local oscillator LO can be configured to provide an LO signal to a mixing unit of the respective receiver circuit 14*a*, 14*b* to mix the stimulus signal down to an IF. The local oscillator LO can be a low frequency local oscillator.

The system 10 can comprise at least one further ADC unit 16*b* which is connected to an output of the further receiver circuit 14*b*. For example, at least one or all of the port units 12 can comprise two ADC units 16*a*, 16*b* which are each connected to one of the receiver circuits 14*a*, 14*b* of the port unit 12. Thereby, the ADC units 16*a*, 16*b* do not have to be mounted on the same PCB (printed circuit board) than the port unit 12 circuitry. For instance, each port unit 12 can have its own PCB. However, it is also possible that two or more port units 12 are arranged on the same PCB.

The system 10 can further comprise a processor 29, e.g. a microprocessor or ASIC, which can be arranged in the base unit 11. The processor 29 can receive the digitalized signals (i.e., reflected/transmitted stimulus signals) from the ADC units 16*a*, 16*b*. The processor 29 can be configured to determine S-parameters of the DUT if the test and/or measurement system is operating in the S-parameter measurement mode, and/or to determine noise properties of the DUT if the test and/or measurement system is operating in the noise measurement mode.

The noise properties may comprise any combination of the following parameters: a noise figure, a noise parameter, a gain-over-temperature value (G/T value), a noise spectral density, an excess noise ratio, and a noise temperature.

The noise figure (short: NF) is a figure of merit that indicates the noise introduced by a two-port component in a signal chain. For instance, the noise figure can be determined as the ratio of an input signal-to-noise ratio (SNR) to an output SNR of the two-port component. The NF can be determined in dependence of an input reflection factor which is seen by the DUT 40 respectively which the DUT 40 is offered at the test port 31.

For example, the G/T value can be determined if the system 10 has an antenna and/or integrated LNA, in particular when communicating over-the-air (OTA) with the DUT 40.

For instance, the processor 29 is configured to determine the S-parameters first and to use said S-parameters to determine the noise properties. Therefore, the system 10 can first operate in the S-parameter measurement mode and subsequently in the noise measurement mode.

FIGS. 2 and 3 show exemplary embodiments of the system 10 where both the known noise source 33 and the switching unit 15 are arranged in the port units 12. For instance, one port unit 12 comprises the signal source 17 and the known noise source 33 and another port unit 12 comprises only the signal source 17, but not the known noise source 33.

The image-free receiver circuit 14*a* can be configured reduce the effect of unwanted signal frequencies (so-called "image frequencies) on its output signal. In general, a receiver circuit can generate an IF (intermediate frequency) signal from an RF signal (e.g., the stimulus or a test signal) received at its input by mixing said RF signal with the local oscillator LO signal. However, an unwanted signal at an image frequency of the RF signal could be mixed to the same intermediate frequency. The image frequency depends on the RF and the LO signal. The image-free receiver circuit 14*a* can use different techniques to prevent such image frequency signals from affecting the generated IF signal.

The image-free receiver circuit 14*a* can comprises a low noise amplifier (LNA) 32 to amplify an RF signal received at its input. The LNA 32 can be arranged close to the input of the image-free receiver circuit 14*a*.

The image-free receiver circuit 14*a* can further comprise a low-pass filter 35 and/or a conversion unit 36 which is configured to convert an RF signal received at the input to the image-free IF signal. A switching unit 34*a*, 34*b*, which e.g. comprises two controllable switches, can be configured to alternatively switch the conversion unit 36 and the low-pass filter 35 between the LNA 32 and the output of the image-free receiver circuit 14*a*.

In case the low-pass filter 35 is switched between the LNA 32 and the output, there might be no mixer in the signal path to mix a received RF signal to the baseband. Therefore, the ADC unit 16*a* connected to the output of the receiver circuit 14*a* can be configured to operate over a broad frequency bandwidth to cover the bandwidth of the forwarded signal. In case the conversion unit 36 is used, the image free IF signal can be output to the ADC unit 16*a* for digitalization.

Both the low-pass filter 35 and the conversion unit 36 can be used in the noise measurement mode to forward a noise signal received from the DUT 40 to the ADC unit 16*a* for calculating the noise properties.

FIGS. 4A-4D show exemplary embodiments of the conversion unit 36 of the image-free receiver circuit 14*a*.

Figure 4A:
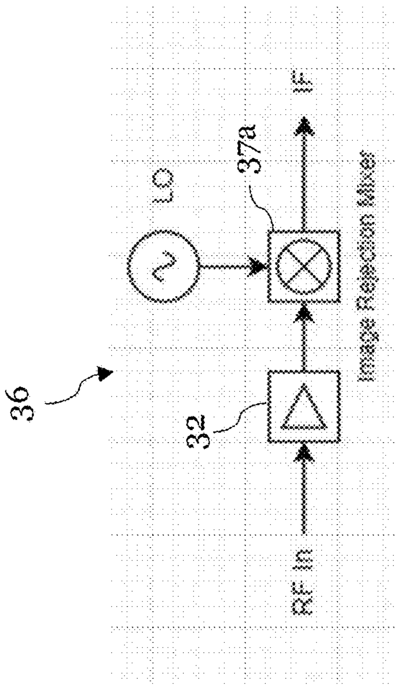
FIGS. 4A-4D show exemplary embodiments of a conversion unit of an image-free receiver circuit.

The exemplary conversion unit 36 shown in FIG. 4A comprises an image rejection mixer 37*a*. This image rejection mixer 37*a* is a specific type of mixer which is configured to cancel out the unwanted mix products. For instance, the image rejection mixer 37*a* separates the LO signal from the local oscillator LO in two separate LO signals of different phase.

Figure 4B:
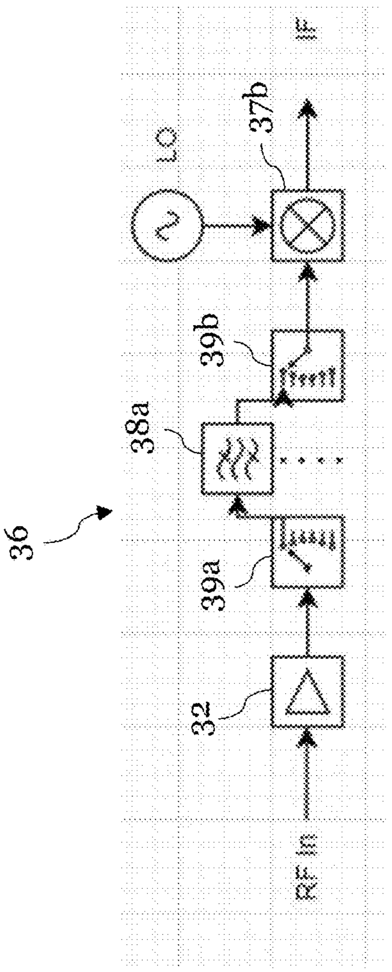

The exemplary conversion unit 36 shown in FIG. 4B comprises a filter bank with a number of bandpass filters 38*a* that can be selectively switched in the signal path between the LNA 32 and a mixer 37*b* using two switching units 39*a*, 39*b*.

Figure 4C:
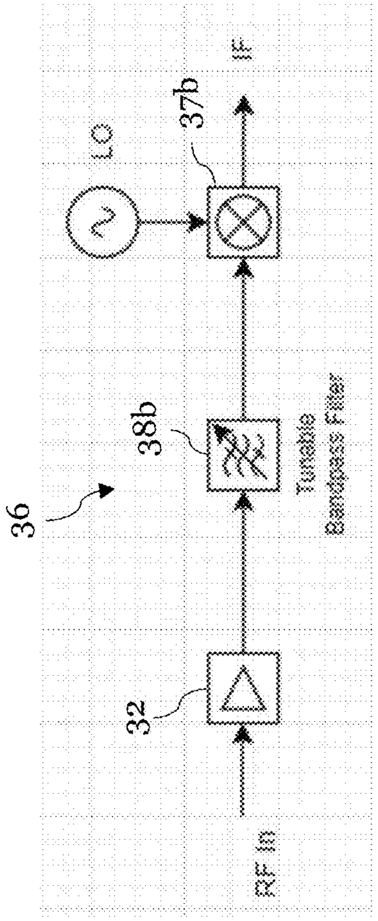

The exemplary conversion unit 36 shown in FIG. 4C comprises a tunable bandpass filter 38 whose passband can be adjusted (tuned) to different frequency ranges. Similar to the filter bank this allows setting of the passband to a desired frequency range of a (wanted) RF signal while rejecting other signals (e.g., an image frequency signal).

Figure 4D:
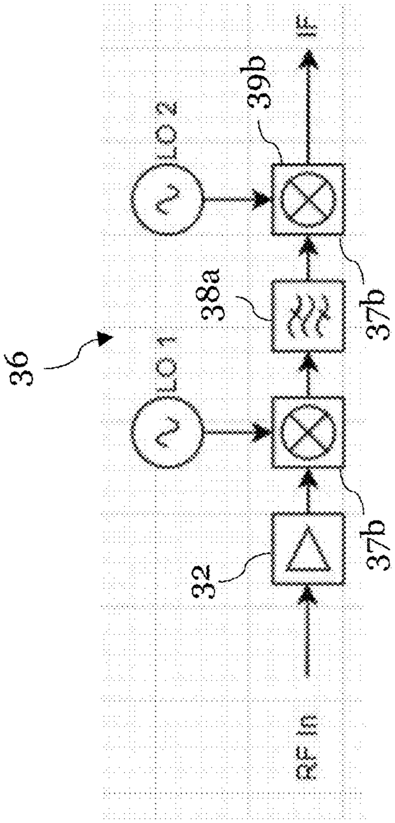

The exemplary conversion unit 36 shown in FIG. 4D comprises multiple conversion stages, each conversion stage having a mixer 37*b* and a local oscillator LO1, LO2. A bandpass filter 38*a* can be arranged between the two stages. In this way, a multiple conversion receiver can be formed which suppresses unwanted image frequency components in the resulting IF signal.

The test and/or measurement system 10 as shown in any one of FIGS. 1 to 3 can comprise an additional low noise amplifier which can be switched in front of the image-free receiver 14*a*, e.g. by means of the directive network 18, when carrying out a noise measurement. In this way, a low receiver noise number can be ensured. The received noise signal can then be mixed in the entire receiver bandwidth to the IF of the base unit 11 and converted to a digital signal by the ADC unit 16*a*. Thus, the entire noise signal can be obtained directly without a frequency sweep, which brings a distinct measurement speed advantage over a frequency sweep. The converted noise signal can then be digitally divided into the individual spectral components and the frequency-dependent noise number of a DUT 40 can be determined therefrom. This additional LNA can be a component of a "low frequency extension" (part of an "interface box") of the system 10.

Figure 5:
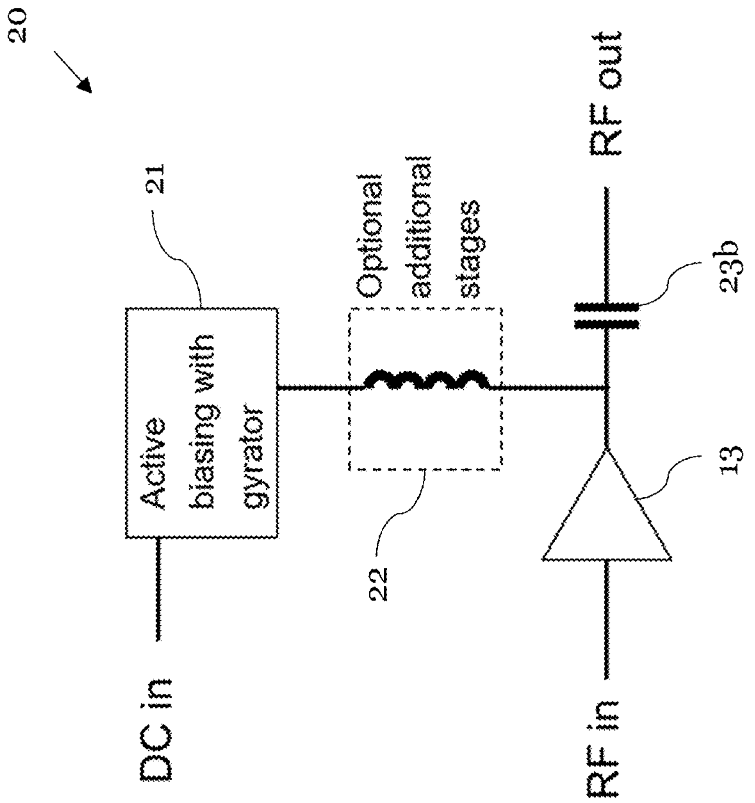
FIG. 5 shows a schematic diagram of a biasing circuit for an amplifier according to an embodiment.

FIG. 5 shows a schematic diagram of an amplifier 13 with a biasing circuit 20 according to an embodiment. The amplifier 13 can be the amplifier 32 of the image-free receiver circuit 14*a* or the (optional) additional amplifier which is switched in front of the image-free receiver circuit 14. The biasing circuit 20 is used for providing a bias current and/or voltage to the amplifier 13, in particular during the noise measurement mode.

The biasing circuit 20 comprises a gyrator circuit 21 (also referred to as: gyrator unit) which can comprise an input port for receiving a DC bias voltage. The bias current and/or voltage which is provided to the output port of the amplifier 13 by the bias circuit 20 can be generated by the gyrator circuit 21 based on said DC bias voltage.

The gyrator circuit 21 can provide an impedance of more than 100 μH, 200 μH, 500 μH, 800 μH, 1 mH, 2 mH, 4 mH, 8 mH, 30 mH, 60 mH, 100 mH, or 200 mH to the output port of the amplifier 13.

Besides the gyrator circuit 21, the biasing circuit 20 can comprise at least one passive element 22 or stage. The passive element 22 can be electrically connected between the gyrator circuit 21 and the output port of the amplifier 13. In FIG. 5, the passive element 22 is an inductance. However, the passive elements may also comprise a capacitance and/or a resistance.

Figure 6:
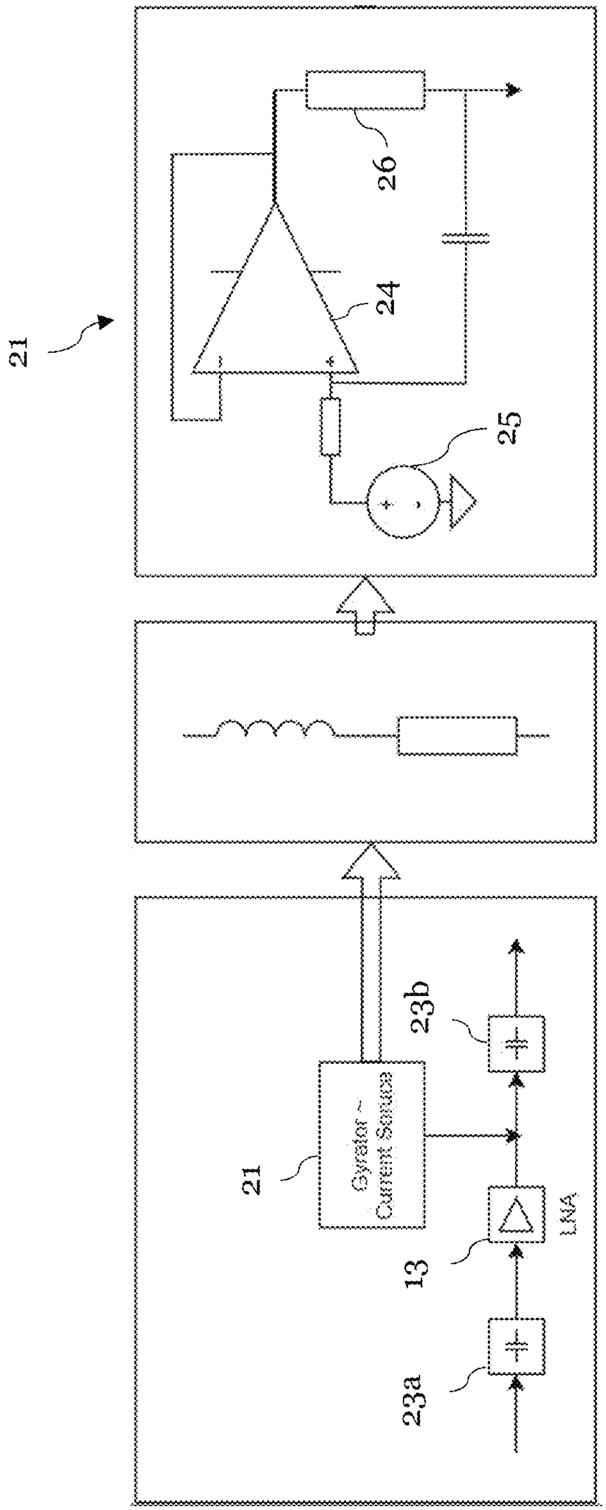
FIG. 6 shows a schematic diagram of a gyrator circuit according to an embodiment.

FIG. 6 shows a schematic diagram of the gyrator circuit 21 according to an embodiment.

As shown in the left image of FIG. 6, the gyrator circuit 21 can be connected to an output port (or output terminal) of the amplifier 13, e.g., between the output port of the amplifier 13 and a capacitor 23*b*. A further capacitor 23*a* can be connected in front of the amplifier. The center image of FIG. 6 shows an equivalent circuit of the gyrator circuit 21 which indicates electrical characteristics of the gyrator circuit 21. The right image of FIG. 6 shows an exemplary circuit structure of the gyrator circuit 21 for biasing the amplifier 13.

The gyrator circuit 21 can be in the form of an active gyrator circuit comprising at least one operational amplifier 24. As shown in FIG. 6 the gyrator circuit 21 can be connected to a DC source 25 for receiving the DC bias signal. Further, the gyrator circuit 21 can comprise further passive elements, such as a capacitance 27 and a resistance 26. Furthermore, the gyrator circuit 21 can comprise a feedback path.

Thus, compared to a conventional bias tee circuit, the coil (or a part thereof in case of a multi-stage bias-tee) is replaced by an active circuit. The bias circuit 20 can replicate the general function of a coil via the gyrator circuit 21. In addition, the biasing circuit 20 can be used for regulating the DC supply voltage similar to a linear regulator. An advantage of using this biasing circuit 20 is the fact that the output resistance of the gyrator circuit 21 is very low. Furthermore, the biasing circuit 20 can operate at low frequencies of less than 100 MHz of an RF signal to be amplified, allowing the amplifier 13 to operate over a wide frequency range. Furthermore, the gyrator circuit 21 requires less space and exhibits less parasitic effects than a conventional coil, in particular a coil for low frequencies.

However, it is of course also possible to bias the amplifier 13 with a conventional bias tee circuit, especially when operating at higher frequencies.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the present disclosure may have been disclosed with respect to only one of several implementations, such feature may be combined with one or more other features of the other implementations as may be desired and advantageous for any given or particular application.

The invention claimed is:

1. A test and/or measurement system, comprising:

a base unit comprising a plurality of test ports which are connectable to a device-under-test (DUT);

wherein the base unit comprises at least one port unit which is electrically connected to one of the plurality of test ports; and wherein the at least one port unit comprises an image-free receiver circuit, wherein an input of the image-free receiver circuit is directly or indirectly connected to the one test port;

the test and/or measurement system further comprising:

at least one analog-to-digital converter (ADC) unit, wherein an output of the image-free receiver circuit is electrically connected to the at least one ADC unit; and a signal source configured to generate a stimulus signal and/or a known noise source configured to generate a noise signal;

wherein, if the test and/or measurement system operates in an S-parameter measurement mode, the stimulus signal is feedable to a first port of the DUT; and/or, if the test and/or measurement system operates in a noise measurement mode, the noise signal is feedable to the first port or to a second port of the DUT; and wherein the input of the image-free receiver circuit is connectable to the first port or the second port of the DUT.

2. The test and/or measurement system of claim 1, wherein a frequency bandwidth of the at least one ADC unit is equal or greater than a frequency bandwidth of the image-free receiver circuit it is connected to.

3. The test and/or measurement system of claim 1, wherein the image-free receiver circuit comprises a low noise amplifier; and wherein the image-free receiver circuit comprises a low-pass filter unit and/or a conversion unit, wherein the conversion unit is configured to convert a radio frequency (RF) signal received at the input of the image-free receiver circuit to an image-free intermediate frequency (IF) signal and to output the image-free IF signal at the output of the image-free receiver circuit.

4. The test and/or measurement system of claim 3, wherein the conversion unit comprises at least one of: an image rejection mixer, an image rejection circuit based on a filter bank, an image rejection circuit based on a tunable bandpass filter, and a multiple conversion receiver.

5. The test and/or measurement system of claim 3, wherein the at least one port unit comprises a switching unit which is configured to alternatively switch the conversion unit and the low-pass filter unit between the low noise amplifier and the output of the image-free receiver circuit.

6. The test and/or measurement system of claim 1, wherein the signal source is arranged in the base unit or in a housing which is external to a housing of the base unit, or wherein at least one or all port units comprise a respective signal source.

7. The test and/or measurement system of claim 1, wherein the known noise source is arranged in the base unit or in a housing which is external to a housing of the base unit, or wherein at least one or all port units comprise a respective known noise source.

8. The test and/or measurement system of claim 1, further comprising:

a further switching unit which is configured to switch the signal source to the first port of the DUT if the test and/or measurement system operates in the S-parameter measurement mode and/or to switch the known noise source to the first or the second port of the DUT if the test and/or measurement system operates in the noise measurement mode.

9. The test and/or measurement system of claim 1, wherein the known noise source is an active noise source or a passive noise source.

10. The test and/or measurement system of claim 1, wherein the known noise source has an impedance that matches the system impedance of the at least one port unit that is connected to the DUT, or wherein the known noise source comprises an impedance tuner in case the impedance of the known noise source does not match the system impedance of the at least one port unit that is connected to the DUT.

11. The test and/or measurement system of claim 1, further comprising:

wherein the at least one port unit comprises a further receiver circuit wherein an input of the further receiver circuit is directly or indirectly connected to the one test port.

12. The test and/or measurement system of claim 11, further comprising:

a directive network which is electrically connected to the signal source, the image-free receiver circuit, the further receiver circuit and one of the plurality of test ports.

13. The test and/or measurement system of claim 12, further comprising:

wherein, if the test and/or measurement system is operated in the S-parameter measurement mode, the directive network is configured to forward a first part of the stimulus signal to the DUT, a second part of the stimulus signal to one of the image-free receiver circuit or the further receiver circuit, and a reflection of the first part of the stimulus signal from the DUT to the other one of the image-free receiver circuit or the further receiver circuit.

14. The test and/or measurement system of claim 12, further comprising:

wherein, if the test and/or measurement system is operated in the S-parameter measurement mode, the directive network is configured to forward the stimulus signal after being transmitted by the DUT to the image-free receiver circuit or the further receiver circuit.

15. The test and/or measurement system of claim 1, wherein the at least one port unit comprises a local oscillator (LO) which is configured to generate an LO signal;

wherein the local oscillator is electrically connected to both the image-free receiver circuit and the further receiver circuit of the respective port unit.

16. The test and/or measurement system of claim 1, further comprising:

at least one further ADC unit, wherein an output of the further receiver circuit is electrically connected to the at least one further ADC unit.

17. The test and/or measurement system of claim 16, wherein the at least one port unit comprises two of the at least one ADC unit and the at least one further ADC unit.

18. The test and/or measurement system of claim 1, further comprising:

a processor which is configured to determine S-parameters of the DUT if the test and/or measurement system is operated in the S-parameter measurement mode, and/or to determine noise properties of the DUT if the test and/or measurement system is operated in the S-parameter measurement mode.

19. The test and/or measurement system of claim 18 wherein the processor is configured to determine the S-parameters first and to use said S-parameters to determine the noise properties.

20. The test and/or measurement system of claim 18, wherein the noise properties comprise at least one of the following: a noise figure, a noise parameter, a gain-over-temperature value, a noise spectral density, an excess noise ratio, and a noise temperature.

* * * * *